United States Patent [19]

Naganuma

[11] Patent Number: 4,827,159

[45] Date of Patent: May 2, 1989

[54] HIGH POWER BUFFER CIRCUIT WITH LOW NOISE

[75] Inventor: Masayuki Naganuma, Kawasaki, Japan

[73] Assignee: Fujitsu Limited, Kanagawa, Japan

[21] Appl. No.: 58,313

[22] Filed: Jun. 5, 1987

[30] Foreign Application Priority Data

Jun. 25, 1986 [JP] Japan .................... 61-149023

[51] Int. Cl.⁴ .................... H03K 17/16; H03K 19/094
[52] U.S. Cl. .................... 307/443; 307/446; 307/451; 307/594; 307/263
[58] Field of Search .............. 307/443, 446, 448, 451, 307/475, 263, 592, 594, 603

[56] References Cited

U.S. PATENT DOCUMENTS

| | | | |
|---|---|---|---|
| 4,164,842 | 8/1979 | Ebihara | 307/270 X |
| 4,518,873 | 5/1985 | Suzuki et al. | 307/451 |
| 4,567,378 | 1/1986 | Raver | 307/270 |
| 4,584,491 | 4/1986 | Ulmer | 307/475 |
| 4,587,445 | 5/1986 | Kanuma | 307/475 X |
| 4,622,482 | 11/1986 | Ganger | 307/263 X |
| 4,638,187 | 1/1987 | Boler et al. | 307/443 X |
| 4,672,243 | 6/1987 | Kirsch | 307/443 X |

Primary Examiner—David Hudspeth
Attorney, Agent, or Firm—Armstrong, Nikaido, Marmelstein, Kubovcik & Murray

[57] ABSTRACT

A CMOS output buffer circuit is reduced its output pulse noise and excess current which runs through the CMOS when it is switched ON and OFF. In the gate circuits of p and n channel FETs of the CMOS output buffer circuit, a time constant circuit is inserted. The time constant circuit slightly slows down the voltage variation of input signals to the gates, so the rush current which runs through the output FETs for charging up or discharging the load capacitance is decreased. So, the dI/dt noise is reduced, but the total switching time of the output circuit is not so much affected. By the difference of time lags between the build up and trailing edges of input pulses for both output FETs, one of the output FETs becomes conductive always after the other one is cut off. So, the excess current is reduced. The time constant circuit is composed of a series connected resistor and inverter circuit, connected between positive and negative voltage sources. The time constant circuit many be provided in both or one of the driving circuits for the output FETs. The resistors may be replaced by FETs having proper internal resistances.

16 Claims, 3 Drawing Sheets

HIGH POWER BUFFER CIRCUIT WITH LOW NOISE

BACKGROUND OF THE INVENTION

The present invention relates to a complementary metal oxide semiconductor (CMOS) type output buffer circuit for driving a high current load, and more precisely, it relates to a buffer circuit which suppresses its output noise and an excess current which inherently runs through the CMOS circuit at an instant when input signal is switched from ON to OFF or vice versa.

Recently as the integration of circuitries in an IC (integrated circuit) increases, the logic circuits of the IC designed to be operated by as little power as possible, while the loads driven by the IC are unchanged or increasing because many loads are driven at a same time. Therefore, the buffer circuits provided in the IC are becoming large and are increasing in number to drive such loads. But as the output of the buffer circuit becomes large and its switching speed is increased, a problem is caused by switching noise of the output buffer circuits. Namely, quick change of a large current in the output buffer circuit induces noise, and causes malfunctions of operation in the inner logic circuits of the IC. Such a trend is especially becoming severe in large scale integrated circuits (LSI), in which a chance increases that many of the output buffer circuits are operated at a same instant, thus increasing the noise.

A conceptual circuit diagram of an exemplary output buffer circuit used in many of ICs is shown in FIG. 7, wherein a vertical chained line indicates a border between the LSI and outer circuit. The left hand side of the chained line indicates the inside of the IC, it may be considered as an IC chip or package, and the right hand side indicates the outside of the IC. The output signal of the inner circuit (not shown) of the IC appears at a circuit point 1, which is an input terminal for the output circuit. In this example, the output circuit is composed of two stages of inverter, the first stage inverter 2 is a smaller size inverter which operates as a driver circuit, and the second stage is a large inverter composed of series connected p and n channel FETs (field effect transistors) 31 and 32 respectively. Gates of these FETs are connected in common and receives the output of the first inverter 2. Drains of the FETs 31 and 32 are connected to each other and provides the output. 41, 42 and 43 ... are loads driven by the output circuit 3. They are connected in parallel in this example.

In ordinary ICs, the FETs 31 and 32 are designed to have a current handling capacity large enough to provide current for driving the loads. Accordingly, the ratio (W/L) of the gate width (W) to the gate length (L) of the FETs is designed to be large in order to reduce their internal resistances to provide large current. But in such prior art circuits, there occurs a problem of noise when the load is driven ON and OFF caused by a quick change of the driving current I running through the output buffer circuit. As mentioned before, such problem is further emphasized in LSIs because there increases a chance that many of such large output currents from many output circuits are switched ON and OFF at the same time.

An attempt to overcome such problem has been proposed by S. Fujii et al. They intend to reduce the noise by decreasing dI/dt a time derivative of the current in the output buffer circuit. This has been done by slightly blunting the wave form of input signal to the output buffer circuit. By such blunting, the overall switching speed of the output circuit is not affected substantially, because most of the switching speed of the output circuit is determined by saturation current of the output buffer circuit, and only the noise has been reduced. More detail is disclosed in, for example, Japanese Laid Open Patent 60-136238 (published on July 17, 1985) by S. Fujii etal, and the same is now issued as U.S. Pat. No. 4,272,266. It is also applied to EPC as European Pat. Appln. No. 84308891.5.

By the method proposed by Fujii et al, the noise of the output buffer circuit has been suppressed cleverly, but there still remained another problem. That is the excess current which instantaneously runs through the output buffer circuit when the inverter circuit is switched from ON to OFF or vice versa. There is an instance during which both of the series connected p and n channel FETs in the output buffer circuit become conductive, so an excess current runs from the positive voltage source through the CMOS circuit to the negative side voltage source, and it increases when the internal resistance of the FETs of output buffer circuit is reduced. Such excess current is undesirable for an IC because it increases the loss of the circuit and causes a temperature rise of the IC chip. It also induces noise, since such excess current becomes a sharp pulse. Such phenomena are known in the art, and several ideas to avoid such excess current have been proposed. For example, U.S. Pat. No. 4,164,842 by Ebihara discloses a method to insert a delay circuit in respective input side of the p and n channel output FETs for slightly shifting the input pulses from each other when they reach to respective gate of the output FETs, to eliminate the instance during which both of the series connected p and n channel FETs become conductive at the same time.

But there was not a simple way to avoid both the noise and the excess current.

SUMMARY OF THE INVENTION

The object of the invention, therefore, is to provide an output buffer circuit having a large current handling capacity of which noise is reduced and the excess current is also suppressed.

Another object of the invention is to attain the above object in a simple manner.

The output buffer circuit according to the present invention is provided with a CMOS inverter having a large current handling capacity. The p and n type FETs are connected in series but their gates are not connected to each other. A kind of time constant circuits are inserted between the input terminal and each of the gate electrodes of CMOS FETs composing the output buffer circuit. The time constant circuit slows down the current variation of the input pulse to the CMOS circuit, that decreases dI/dt and hence the noise is decreased. At the same time, the building up and trailing edges of the input pulses for each of the output FETs are shifted from each other, thereby the instant during which both of the p and n channel transistors become conductive at the same time is avoided, and the excess current is suppressed.

By the insertion of the time constant circuits, the input pulse for the p and n channel FETs are automatically shifted from each other. So, the object of reducing noise and excess current is attained by a simple manner.

Further, the time constant circuit for one of the FETs may be eliminated. So, the circuit becomes more simple.

These and other advantages of the invention will become clear from a reading of the following disclosure taken in connection with preferred embodiments and the appended claims.

BRIEF DESCRIPTION OF DRAWINGS

FIG. 2 shows voltage variations with respect to time in various points of the circuit of FIG. 1, wherein:

FIG. 2 (A) shows the variation of voltage when the input voltage is pulled down from high state H to low state L; and FIG. 2(B) shows the variation of voltage when the input voltage is pulled up from low level L to high level H.

FIG. 3 illustrates the current variation and its time derivative dI/dt in the output FETs corresponding to the timing of FIG. 2, wherein:

FIG. 3(A) illustrates the current variation in the output FET, comparing the prior art circuit and the present invention; and FIG. 3(B) compares the time derivative of the current in the output FETs of the prior art and the present invention, showing how the noise is reduced.

Same or similar reference numerals designate same or corresponding parts throughout the drawings.

DESCRIPTION OF PREFERRED EMBODIMENTS

Figure 1:
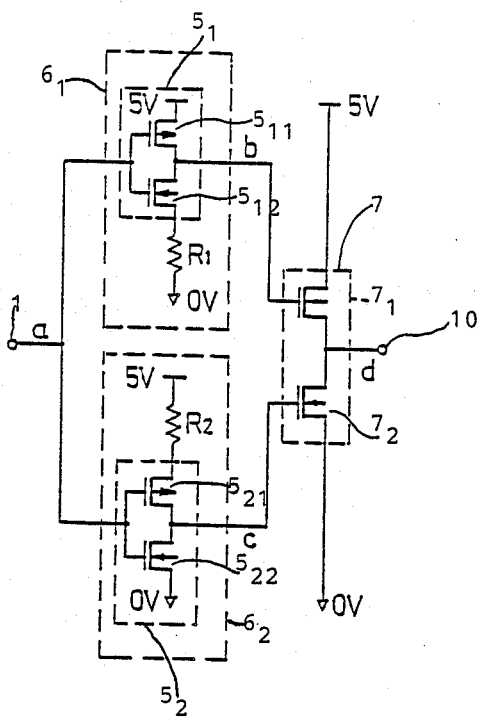
FIG. 1 is a circuit diagram of a first embodiment of the present invention which comprises time constant circuits in both gate circuits of the output CMOS circuit.

FIG. 1 is a circuit diagram showing first embodiment of the output buffer circuit by the present invention. The circuit is composed of an output CMOS inverter 7, and the time constant circuits 61, 62, which drive respectively the p and n channel output FETs 71 and 72 of the CMOS inverter 7. The drain of the p channel output FET 71 is connected to the drain of the n channel output FET 72, and provide the output signal to an output terminal 10. The inverter 7 is connected in series between a positive and negative voltage source. In this embodiment, 5 volts are applied for the positive voltage, and the negative voltage is 0 that is ground voltage. The output FETs 71 and 72 have large current handling capacity to supply enough current to the load (not shown).

Figure 7:
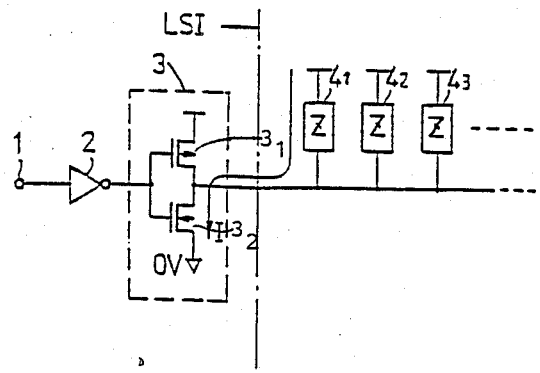
FIG. 7 shows an exemplar CMOS output buffer circuit of prior art.

Comparing the output CMOS circuit 7 of FIG. 1 with that of prior art shown in FIG. 7, the gate electrodes of CMOS transistors 71 and 72 are not connected to each other, but they are respectively driven by the time constant circuits 61 and 62, which are encircled by a chained line respectively. These time constant circuits comprise respectively a driver circuit 51 or 52, whose input gate electrodes are connected in common to the input terminal 1. In this embodiment, the driver circuits 51 and 52 are inverters, which are composed of series connected p and n channel FETs 511, 512 and 521, 522 respectively. But it will be apparent for the one skilled in the art that the driver circuits 51 and 52 may be replaced by any kind of driver circuits, such as non inverting type drivers. But the inverter is most commonly used in the art, so the disclosure hereinafter will be described referring to the inverters. The circuits described hereinafter, therefore, should be considered in all respects as illustrative and not restrictive.

In FIG. 1, the inverter 51 is connected in series with a resistor R1, and connected between the positive and negative voltage source (5 volts and 0 volt for example). While the inverter 52 is connected in series with a resistor R2, and connected between the positive and negative voltage sources. As can be seen in FIG. 1, the resistor R1 is connected between the source of the n channel FET 512 and the negative voltage source (0 volt), while the resistor R2 is connected between the positive voltage source (5 volts) and the source of the p channel FET 521. The inverter 51 and the resistor R1 compose a time constant circuit 61, and the inverter 52 and the resistor R1 composes another time constant circuit 62.

Figure 2:
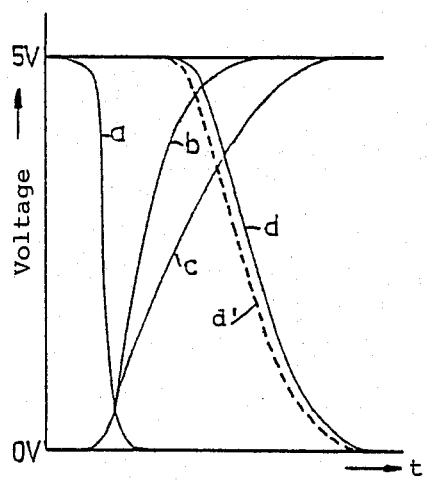
Figure 2:
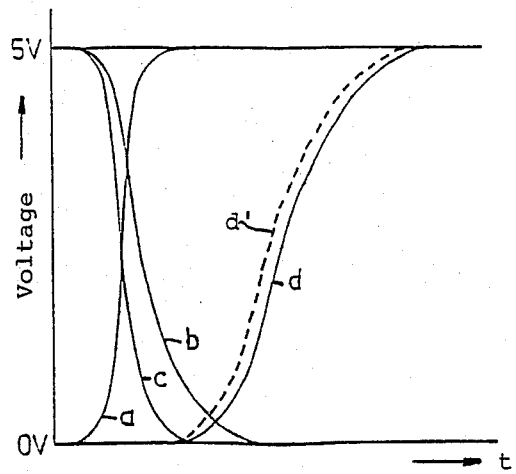

The operation and effects of the circuit will be described referring to FIG. 2 which illustrates the variation of voltage with respect to time t (abscissa) at various circuit points indicated in FIG. 1. Consider a case when a signal at the input terminal 1 is switched from a high level H to a low level L. FIG. 2(A) shows the voltage variation in such case. The curve a shows the variation of voltage at the circuit point a, that corresponds to the input voltage at the terminal 1 or the gate voltage for the driver circuits 51 and 52. When the gate voltage is switched from H to L, the p channel FETs 511 and 521 become ON, and the n channel FETs 512 and 522 become OFF state. So, the output of the driver circuits 51 and 52 varies from L to H level as shown respectively by curves b and c. It should be noted that the curve b, which indicates the gate voltage of the p channel FET 71, builds up faster than the curve c that is the gate voltage of the n channel FET 72. Because the gate of the p channel FET 71 is charged up from the positive voltage source through the p channel FET 511, while the gate of the n channel FET 72 is charged up from the positive voltage source through the resistor R2 and the p channel FET 521. So, the time constant to charge up the gate of the FET 71 is smaller than that of the FET 72. When the gates of the output buffer circuits are switched from L to H state, the p channel FET 71 becomes OFF and the n channel FET 72 becomes ON state, so the charges stored in capacity of outer load (not shown) is discharged through the n channel FET 72, and the output voltage goes down as shown by the curve d.

When the output transistor (72 in this embodiment) is switched from OFF to ON, the rush current that runs through the output buffer circuit to discharge capacity of the outer load is very high, because the inner resistance of the buffer circuit is designed to be very low. This provides a sharp build up of current in the FET 72, and generates a noise. But in this embodiment, the voltage variation of the gate voltage of the FET 72 is slowed down as shown by the curve c in FIG. 2(A), it varies slowly compared to that of the prior art circuits, accordingly the rush current is suppressed, and the noise is reduced.

The above situation is illustrated in FIGS. 3(A) and 3(B), which shows currents and its time derivative (dI/dt) running through the output FET 72 with respect to time t. In the figures, the abscissa the time scale is taken same to that of FIG. 2(A). If there is not provided the time constant circuit in the input side of the FET 72, the voltage build up of the gate electrode of the FET 72 becomes as fast as the curve b in FIG. 2(A), therefore, the current which runs through the FET 72 will become as shown by a curve e in FIG. 3(A). Therefore, dI/dt the time derivative of the current becomes very large as shown by a curve g in FIG. 3(B), and the noise is generated. But in this embodiment, since the variation of gate voltage of the FET 72 is slowed down by the time constant circuit as shown by the curve c in FIG. 2(A), the current through the FET 72 becomes as shown by a curve f in FIG. 3(B). Hence, dI/dt is reduced and the noise is suppressed as shown by a curve h in FIG. 3(B).

It should be pointed out that even the wave form (curve c of FIG. 2(A)) of the input voltage to the output buffer circuit is slowed down, the over all switching time of the circuit is substantially not increased. Because the over all switching time is determined by total time to charge up or discharge the charges stored in capacity of load through the output FET. The current flow in the output FET is determined its gate voltage. If there is not provided a time constant circuit, like prior art circuit, the current build up in the output FET is very quick, but the current reaches quickly to a saturation current of the output FET (72 in this embodiment). After that, as shown in FIG. 3(A), the constant saturation current continues, but as the voltage of the load capacity decreases, the current decreases, and it flows until entire charges in the load capacity is discharged. Therefore, the voltage of the output terminal goes down as shown by a broken line curve d' in FIG. 2(A).

On the contrast, in the present invention, due to the time constant circuit inserted in the gate circuit of the output FET, the build up curve of the output current is slowed down as shown by a curve f in FIG. 3(A), but it also soon reaches to the saturation current and continues the discharging, and goes down like a similar manner as the curve f. Therefore, the total time T to discharge the outer load capacity becomes slightly longer compared to that of the prior art, but it is almost same as that of prior art, because the total time to discharge is substantially determined by the saturation current and the capacity of the outer load. Therefore, by the insertion of the time constant circuit, only the noise is reduced and the over all switching speed of the circuit is not reduced substantially.

FIG. 2(B) illustrates the voltage variation at the same circuit points in FIG. 1 when the input voltage is switched from L to H level. When the input voltage is increased from L to H as shown by the curve a, the p channel FETs 511 and 521 become OFF and the n channel FETs 512 and 522 become ON. Then the charges stored in the gates of the output FETs are discharged to the ground through the n channel FETs 512 and 522, and the gate voltages of the FETs 71 and 72 goes down respectively as shown by the curves b and c. The gate voltage of the p channel FET 71 (curve b) goes down slowly compared to the gate voltage of the FET 72 (curve c) due to the difference of time constant caused by the resistor R1. Therefore, the output voltage goes up slowly as shown by the curve d compared to a broken line curve d' which is the voltage variation of the output terminal of prior art circuit. It will be clear for the one in the art that the effect of decreasing the noise and switching speed is the same as those described above.

The output buffer circuit by the present invention has further effect that reduces the excess current which is inherent to ordinary CMOS circuit. This will be explained referring to FIG. 2. In FIG. 2(A), the curve b shows the variations of gate voltage of the p channel FET 71. But as mentioned before, in ordinary output buffer circuits, gates of p and n channel FETs 71 and 72 are connected to each other and they do not include the time constant circuits, therefore, the gate voltage of these FETs vary almost as quickly as the curve b. At the starting time (t=0) of the variation, the p channel FET 71 is ON, but the n channel FET 72 is OFF. Therefore, the current does not flow from the positive voltage source (5 volts) through the CMOS FETs 71 and 72 to the negative voltage source (ground). But as the gate voltage goes up, the n channel FET 72 becomes gradually conductive, and the conductivity of the p channel FET 71 gradually decreases. So, at the middle part of the curve b, both of the FETs 71 and 72 become conductive. Accordingly, the excess current runs from the positive voltage source through the CMOS FETs 71 and 72 to the negative voltage source. When the gate voltage goes up further, the n channel FET 72 becomes ON, but the p channel FET 71 becomes OFF. Therefore, the current between the positive and negative voltage sources through the CMOS is again pinched off.

The situation is similar to FIG. 2(B) which shows the voltage variations when the input voltage is switched from L to H. In ordinary CMOS output buffer circuits, the gate voltage of the FETs 71 and 72 varies as shown by the curve c. By the similar reason described above, the excess current flows from the positive voltage source through the CMOS FETs 71 and 72 to the negative voltage source at middle portion of the curve c.

Theses excess currents runs every time when then CMOS buffer circuit is switched from H to L or vice versa. The excess current increases as the repetition rate of switching is increased, but it does not drive the outer load. It merely increases the loss of the circuit and causes the temperature rise of the IC chips. Such excess current is undesirable for the noise, since as described above, it is a sharp pulse current that flows at the instance when the input signal of the CMOS buffer circuit is switched from ON to OFF or vice versa.

The present invention prevents such excess current. As can be seen in FIG. 2(A), when the input voltage is switched from H to L (curve a), the gate voltage of the FET 72 goes up (curve c) slowly than the gate voltage of the FET 71 (curve b). So, when the n channel FET 72 becomes conductive, the p channel FET 71 is cut off. Similarly, as shown in FIG. 2(B), when the input voltage is switched from L to H (curve a), the gate voltage of the p channel FET 71 (curve b) goes down slowly than the gate voltage of the n channel FET 72 (curve c). So, before the p channel FET 71 become conductive, the n channel FET 72 is cut off. Like such a manner, the excess current is suppressed.

Figure 4:
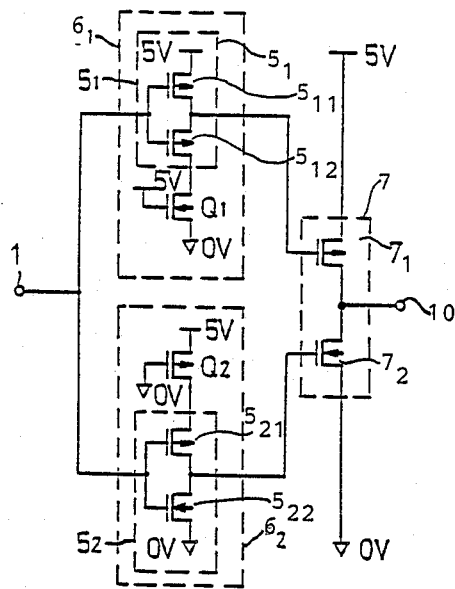
FIG. 4 shows a circuit diagram for second embodiment of the present invention, wherein the resistors in FIG. 1 has been replaced by FETs.

The output buffer circuit of FIG. 1 can be modified in various fashions. FIG. 4 shows a circuit diagram for the second embodiment of the present invention. Comparing the circuit of FIG. 4 with that of FIG. 1, it will be noticed that, the resistors R1 and R2 are replaced respectively by an n channel FET Q1 and a p channel FET Q2. The gate of these FETs are connected respectively to positive and negative voltage source. Accordingly the FETs Q1 and Q2 are always conductive and they can be considered as a resistance. Therefore, the resistors R1 and R2 are respectively replaced by the inner resistance of the FETs Q1 and Q2.

The inner resistance of FET is varied by varying the W/L, the ratio of gate width (W) to gate length (L). So it is easy to design an FET having a preferred value of the inner resistance. In ordinary ICs, especially in gate array type logic ICs, the IC chip are provided with many patterns of FETs having various values of W/L ratio. Therefore, it is possible to chose from these FETs a one having proper internal resistance, and replace the resistors R1 and R2 by them. So it is usually unnecessary to design a new FET for such purpose. The value of the resistance depends on the circuit design of the output FETs to drive the load, and how to slow down the voltage variation of the input signal. In an example the resistance of the resistors R1 and R2 were few k ohms. Further, though it is not shown in the figure, the FETs Q1 and Q2 may be a combination of many FETs connected in series or parallel to each other to provide the preferred value of the inner resistance. This is an ordinary technique of gate array, so, further description is omitted for the sake of simplicity.

Figure 3:
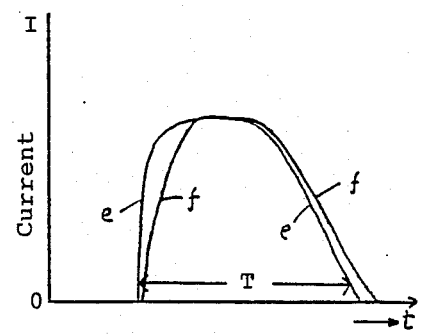
Figure 3:
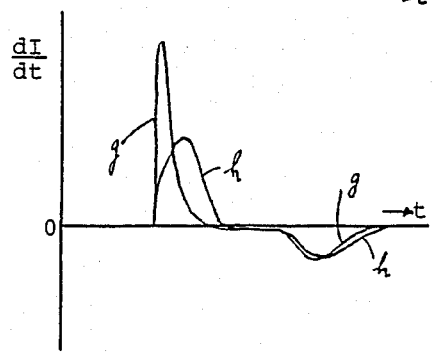
Figure 5:
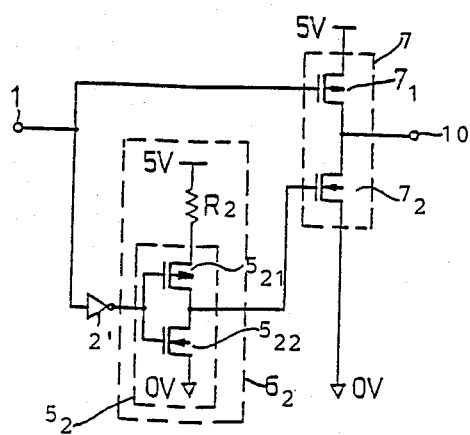
FIG. 5 shows a circuit diagram for third embodiment of the present invention, wherein the time constant circuit is provided only in the gate circuit of the n channel output FET.

FIG. 5 shows a circuit diagram for the third embodiment of the present invention. In this embodiment, the time constant circuit 6 is provided only in the gate circuit of the n channel FET 72. As can be seen in FIG. 3, the current variation in the output FETs are sharper in the left hand side in the figure, namely when the gate voltage of the output FET are pulled up from L to H than that when the gate voltages are pulled down from H to L. Therefore, the time constant circuit for the p channel output FET 71 is eliminated. Since the inverter 51 is eliminated the inverter 2 becomes also unnecessary. So, the gate of the p channel FET 71 is connected directly to the input terminal 1, and an inverter 2' is inserted only in the gate circuit of the inverter 52. It will be apparent for the one in the art that the effects of the invention are similar to those of FIG. 1.

Figure 6:
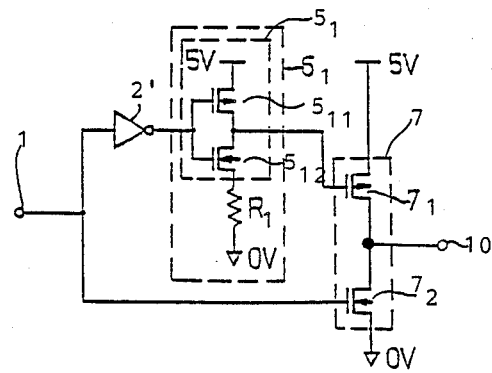
FIG. 6 shows a circuit diagram for fourth embodiment of the present invention, wherein the time constant circuit is provided only in the gate circuit of the p channel output FET.

In the disclosure described hereinbefore, the load of the output buffer circuit 7 is connected between the output terminal of the output buffer circuit 7 and positive voltage source as shown in FIG. 7. But it often occurs that the loads are connected between the output terminal of the buffer circuit and ground. It will be understood for the one skilled in the art that, in such a case, the rush current flows through the p channel output FET 71 to charge up the load capacitance. For such purpose, the fifth embodiment of the present invention as shown in FIG. 6 is applicable. As can be seen in FIG. 6, the time constant circuit 6 and inverter 2' are inserted only in the gate circuit of the p channel output FET 71, and the gate of the n-channel output FET 72 is directly connected to the the input terminal 1. The operation and effect can be easily analogized from the description regarding the circuit of FIG. 5.

As have been described above, the output noise and excess current in CMOS output buffer circuit have been suppressed by inserting simple time constant circuits in the gate circuits of the output FETs. The circuits described with respect to embodiments are possible to modify in various ways without departing from the spirit of the invention. For instance, the inverter circuits may alternately be non inverting type circuits. The resistors used in the third and fourth embodiments may be replaced by FETs. The preferred embodiments described herein are, therefore, to be considered in all respects as illustrative and not restrictive.

What is claimed are as follows:

1. A complementary metal oxide semiconductor (CMOS) type output buffer circuit for suppressing impulsive output noise caused by a rapid variation of a large rush current in an output stage, comprising:
    an input terminal for receiving an input signal;
    a first voltage source for providing a first voltage;
    a second voltage course for providing a second voltage;
    a p channel output field effect transistor (FET) having a gate;
    an n channel output FET having a gate, said p channel output FET and said n channel output FET being connected to each other in series between said first and second voltage sources, said output FETs being commonly connected together at the respective drains thereof and providing an output signal at an output terminal at said common connection;
    a first time constant circuit, connected between said input terminal and one of the gates of said p and n channel output FETs, for slowing down the time rate of change of a signal voltage applied to one of the gates of said p and n channel output FETs in response to the input signal; and
    a second time constant circuit, connected between said input terminal and the other one of the gates of said p and n channel output FETs, for slowing down the time rate of change of a signal voltage applied to said other one of the gates of said p and n channel output FETs in response to the input signal.

2. The CMOS output buffer circuit as set forth in claim 1, wherein said first time constant circuit is connected between said input terminal and the gate of said p channel output FET.

3. The CMOS output buffer circuit as set forth in claim 1, wherein said first time constant circuit is connected between said input terminal and the gate of said n channel output FET.

4. The CMOS output buffer circuit as set forth in claim 1, wherein:
    said first time constant circuit comprises a driver circuit for driving said p channel output FET and a resistor connected in series between said driver circuit and one of the first and second voltage sources.

5. The CMOS output buffer circuit as set forth in claim 2, wherein:
    said first time constant circuit comprises a driver circuit for driving said p channel output FET and a resistor connected in series between said driver circuit and the second voltage source.

6. The CMOS output buffer circuit as set forth in claim wherein:
    said first time constant circuit comprises a driver circuit for driving said n channel output FET and a resistor connected in series between said driver circuit and the first voltage source.

7. The CMOS output buffer circuit as set forth in claim 1, wherein:
    said first time constant circuit is connected to the gate of said p channel output FET and comprises a driver circuit for driving said p channel output FET and a resistor connected in series between said driver circuit and the second voltage source; and said second time constant circuit is connected to the gate of said n channel output FET and comprises a driver circuit for driving said n channel output FET and a resistor connected in series between said driver circuit and the first voltage source.

8. The CMOS output buffer circuit as set forth in claim 1, wherein:

said first time constant circuit is connected to the gate of said p channel output FET and comprises a driver circuit for driving said p channel output FET and an n channel FET connected in series between said driver circuit and the second voltage source, and the gate of said n channel FET is connected to the first voltage source; and said time constant circuit is connected to the gate of said n channel output FET and comprises a driver circuit for driving said n channel output FET and a p channel FET connected in series between said driver circuit and the first voltage source, and the gate of said p channel FET is connected to the second voltage source.

9. The CMOS output buffer circuit as set forth in claim 4, 5, 6, 7 or 8 wherein:

said driver circuit is an inverter composed of a p channel FET and an n channel FET connected in series to each other.

10. The CMOS output buffer circuit as set forth in claim 9, wherein:

said p and n channel output FET have a lower internal resistance than those of the p and an n channel FETs in the inverter.

11. A complementary metal oxide semiconductor (CMOS) type output buffer circuit comprising:
an input terminal (1) for receiving control signals;
an output terminal (10) for providing output signals;
a first voltage source for providing a first voltage;
a second voltage source for providing a second voltage;
a p channel output field effect transistor (FET) (71) having a low internal resistance, source of said p channel output FET being connected to said first voltage source;
an n channel output FET (72) having a low internal resistance, drain of said n channel output FET (72) being connected to drain of said p channel output FET (71) and to said output terminal (10), and source of said n channel output FET (72) being connected to the second voltage source;
time constant circuits (61, 62) respectively connected to gates of said p channel output FET (71) and n channel output FET (72), wherein, said time constant circuit (61) which is connected to the gate of said p channel output FET comprises an inverter circuit (51) composed of a series connected p channel FET (511) and n channel FET (512), for driving the gate of said p channel output FET (71), and a resistor (R1) connected between source of said n channel FET (512) and the second voltage source; and
said time constant circuit (62) which is connected to the gate of said n channel output FET (72) comprises an inverter circuit (52) composed of a series connected p channel FET (521) and n channel FET (522), for driving said n channel output FET (72), and a resistor (R2) connected between source of said p channel FET (521) and the first voltage source, and gates of said p channel FETs (511, 521) and n channel FETs (512, 522) of said inverters are connected in common to said input terminal (1).

12. The CMOS output buffer circuit as set forth in claim 11, wherein:

said resistors (R1, R2) being respectively composed of internal resistance of n channel FET (Q1) and p channel FET (Q2) of which gates are respectively connected to one of said first or second voltage sources.

13. A complementary metal oxide semiconductor (CMOS) type output buffer circuit comprising:
an input terminal (1) for receiving control signals;
an output terminal (10) for providing output signals;
a first voltage source for providing a first voltage;
a second voltage source for providing a second voltage;
a p channel output field effect transistor (FET) (71) having a low internal resistance, gate and source of which being connected respectively to said input terminal (1) and to said first voltage source;
an n channel output FET (72) having a low internal resistance, drain of which being connected to drain of said p channel output FET (71) and to said output terminal (10), and source of said n channel output FET (72) being connected to the second voltage source;
a time constant circuit (62) connected to the gate of said n channel output FET (72), said time constant circuit (62) comprises an inverter circuit (52) composed of a series connected p channel FET (521) and n channel FET (522), for driving the gate of said n channel output FET (72), and a resistor (R2) connected between the source of said p channel FET (521) and the first voltage source; and
a second inverter (2') of which input terminal being connected to said input terminal (1), and output terminal being connected in common to the gates of said p channel FET (521) and n channel FET (522) of said inverter circuit (52).

14. The CMOS output buffer circuit as set forth in claim 13, wherein said resistor comprises the internal resistance of a p channel FET connected to said first voltage source.

15. Complementary metal oxide semiconductor (CMOS) type output buffer circuit comprising:
an input terminal (1) for receiving control signals;
an output terminal (10) for providing output signals;
a first voltage source for providing a first voltage;
a second voltage source for providing a second voltage;
a p channel output field effect transistor (FET) (71) having a low internal resistance, source of which being connected to said first voltage source;
an n channel output FET (72) having a low internal resistance, drain of which being connected to drain of said p channel output FET (71) and to said output terminal (10), and source of said n channel output FET (72) being connected to the second voltage source;
a time constant circuit (61) connected to the gate of said n channel output FET (71), said time constant circuit (61) comprises an inverter circuit (51) composed of a series connected p channel FET (511) and n channel FET (512), for driving the gate of said p channel output FET (71), and a resistor (R1) connected between the source of said n channel FET (512) of the inverter circuit (51) and the second voltage source; and a second inverter (2') of which input terminal being connected to said input terminal (1), and output terminal being connected in common to the gates of said p channel FET (511) and n channel FET (512) of said inverter circuit (51).

16. The CMOS output buffer circuit as set forth in claim 15, wherein said resistor comprises the internal resistance of an n channel FET connected to said second voltage source.

* * * * *